United States Patent [19]
Kobayashi et al.

[11] Patent Number: 5,062,110
[45] Date of Patent: Oct. 29, 1991

[54] LOGIC CIRCUIT TESTING APPARATUS

[75] Inventors: Souichi Kobayashi; Jun-ichi Hinata, both of Hyogo, Japan

[73] Assignee: Mitsubishi Denki Kabushiki Kaisha, Tokyo, Japan

[21] Appl. No.: 55,194

[22] Filed: May 28, 1987

[30] Foreign Application Priority Data

May 30, 1986 [JP] Japan .................. 61-126176

[51] Int. Cl.⁵ .......................................... G01R 31/28
[52] U.S. Cl. .................................................. 371/223
[58] Field of Search ............... 324/73 R; 371/25, 15, 371/16, 22.3

[56] References Cited

U.S. PATENT DOCUMENTS

| | | | |
|---|---|---|---|
| 3,761,695 | 9/1973 | Eichelberger | 324/73 R X |
| 4,597,042 | 6/1986 | D'Angeac et al. | 364/200 |
| 4,602,210 | 7/1986 | Fasang et al. | 324/73 R |
| 4,683,569 | 7/1987 | Rubin | 371/25 |
| 4,701,917 | 10/1987 | Jones et al. | 371/16 |

OTHER PUBLICATIONS

Electronics, Frechette et al., "Support Processor Analyses Errors Caught by Latches", Nov. 8, 1979, pp. 116-118.

Millman, J. et al., *Microelectronics*, 2nd ed., 1987, pp. 327-329.

Primary Examiner—Stephen M. Baker
Attorney, Agent, or Firm—Wolf, Greenfield & Sacks

[57] ABSTRACT

An improved apparatus for testing logic circuits by implementing scan-in/scan-out operations. The improved testing apparatus is provided with input terminals for receiving control signals and data signals, one or more shift-paths each of which is made up of shift registers and control means for enabling a bidirectional shift operation of the shift-paths and for controlling the directions in which the respective shift-paths shift logical values stored in the shift registers thereof. The control means sets the shift direction in accordance with the control signals provided from the input terminals. Thereby, if there is a failing shift register in a shift-path, the failing shift register can be located by implementing the scan-in/scan-out operation utilizing the bidirectional shift of the logical data in the shift-path.

10 Claims, 3 Drawing Sheets

LOGIC CIRCUIT TESTING APPARATUS

BACKGROUND OF THE INVENTION:

1. Field of the Invention

The present invention relates to a logic circuit testing apparatus which can implement a scan-in/scan-out operation.

2. Description of the Prior Art

FIG. 1 shows an example of the prior art logic circuit testing apparatus which can implement a scan-in/scan-out operation. This testing apparatus has four parallel shiftpaths in each of which a plurality of shift registers (hereunder abbreviated to "SRL"s) 1 are linked together in a line. In this figure, the internal circuit arrangement of each of the shift-paths or scan-paths 26, 27 and 28 is the same as that of the shift-path 25 and, thus, the specific circuits are omitted in blocks 26, 27 and 28. Further, this logic circuit testing apparatus has two terminals 3a and 3b each connected to both a decoder 4 and a multiplexer 5. These terminals 3a and 3b receive input signals each indicating which one of the shift paths 25, 26, 27 and 28 is to be used for implementing a scan-in/scan-out operation. The decoder 4 is used to select a path out of the paths 25, 26, 27 and 28 to which "scan-in data" is to be provided from a "scan-in terminal" 6 Further, the multiplexer 5 is used to choose a path among the paths 25, 26, 27 and 28 from which data is provided to a "scan-out terminal" A clock signal causing a shifting operation of the SRL 1 is inputted from the "clock terminal" 9 and transmitted only to the shift-path selected by the decoder 4 through an AND circuit 8. Furthermore, the apparatus of FIG. 1 is provided with a mode switching terminal 10 for receiving a signal indicating a normal mode in which the SRLs 1 normally operate, or another signal indicating a scan mode in which the shift-path operates to set a certain logical value in the SRLs 1.

FIG. 2 shows an example of internal structure of a SRL 1 which is a composing element of the shift-path or scan-path shown in FIG. 1. Reference numeral 101 indicates a common or ordinary flip-flop which is used to fetch and hold data and output the data held by it. Reference numerals 102 and 103 represent N-channel transmission gates (hereinafter abbreviated to "N ch T G"). Further, reference numeral 104 indicates an inverter circuit for taking a logical inversion of a signal received from the mode switching terminal 10. Moreover, reference numeral 105 indicates an input terminal (not shown in FIG. 1) of the flip-flop 101 being in the normal mode and is provided independently to each of the SRLs 1. Reference numerals 13 and 14 represent an input terminal and an output terminal of the flip-flop 101 being in the scan mode, respectively.

The prior art logical circuit testing apparatus which can implement the scan-in/scan-out operation is constructed as above stated.

In case of putting the testing apparatus into the scan mode and activating the shift-path, a signal of high-level "H" is inputted at the mode switching terminal 10. Thus, the signal of high-level "H" is inputted at the gate electrode so that the "N ch T G" 102 turns on. On the other hand, the "N ch T G" 103 turns off because the gate electrode receives a signal of low-level "L" through the inverter 104. This results in the terminal 13 being selected as an input terminal of the flip-flop 101 and the SRLs 1 being connected with each other like a chain so as to make a shift-path. When a "scan-in" operation is implemented to set a logical value in the SRLs 1, signals indicating a certain shift-path to be put the logical value thereinto is first inputted from the terminals 3a and 3b. The signals inputted from the terminals 3a and 3b then goes into the decoder 4 and are decoded therein. The decoder 4 outputs a signal of high-level "H" only to an AND circuit 8 placed at a stage preceding to a desired shift-path and a signal of low-level "L" to the other AND circuits 8. Thus, the clock signal from the terminal 9 is transmitted by way of the AND circuit 8 only to the desired shift-path. The "scan-in data" is inputted from the terminal 6 to the desired shift-path with varying in synchronism with the clock signal and is set in the shift-path from the SRL 1 positioned at the last stage of the desired shift-path to the SRL 1 positioned at the first stage (from left, as viewed in FIG. 1) thereof in that order of the SRL 1. When the number of the stages or SRLs in the desired shift-path times a period of time of the clock signal is passed, it finishes setting the logical values in all of the SRLs 1 of the desired shift-path. Further, in case of setting logical values in the other shift-paths, the desired shift-path is first indicated by signals inputted at the terminals 3a and 3b and further the procedures as above described are to be effected. On the other hand, when a "scan-out" operation is implemented to read out the logical value held in the SRLs 1, the shift-path holding the logical value to be read therefrom is indicated by signals inputted from the terminals 3a and 3b. As in the case of the "scan-in" operation as above described, the clock pulse is transmitted thorough the decoder 4 and the AND circuit 8 only to the indicated shift-path. Moreover, the signals from the terminals 3a and 3b are also inputted to the multiplexer 5 for indicating which of the shift-paths outputs "scan-out data" to the terminal 6. The SRLs 1 placed from the last stage to the first stage of the indicated shift-path output the scan-out data in that order. At the point of time when the number of the stages or SRLs of the indicated shiftpath times a period of time of the clock signal is passed since the beginning of the "scan-out" operation, the readout operation of the logic values held in all the SRLs is completed.

Next, in case of setting the testing apparatus in the normal mode in which each of the SRLs 1 normally operates, a signal of low-level "L" is inputted at the terminal 10. Thus, a signal of low-level "L" is inputted to the gate or electrode so that the "N ch T G" 102 turns off. Conversely, a signal of high-level "H" is inputted through the inverter circuit 104 and thus the "N ch T G" 103 turns on. Thus, the terminal 105 is selected as an input terminal of the flip-flop 101 and accordingly the SRLs 1 are independent of each other and operate in the normal manner.

The prior art logical circuit testing apparatus is constructed as above described and the direction of shifting the logical value held in each SRL of a shift-path is fixed. Therefore, the prior art testing apparatus has a drawback in that if a failure occurs in some of the SRLs of the shift-path, the shift-path in question cannot operate and consequently the failing SRL cannot be located.

The present invention is accomplished to solve the above described problems of the prior art logical circuit testing apparatus.

OBJECT OF THE INVENTION

It is accordingly a primary object of the invention to provide an improved logical-circuit testing apparatus which can effect not only a shift of a logical value held in the logical circuit in the direction (hereafter referred to simply as "forward shift direction") in which the shift can be performed in the prior art apparatus but also another shift of the logical value in the direction (hereunder referred to simply as "backward shift direction") opposite to the "forward shift direction", that is, which can effect a "bidirectionary shift" of a logical value held in the logical circuit, whereby a failing SRL can be located therein.

SUMMARY OF THE INVENTION

To achieve the foregoing object and in accordance with an aspect of the present invention, an improved logical circuit testing apparatus is provided including control means controlling a direction of a shift of a logical value in a shift-path to enable the testing apparatus a "bidirectional shift" operation and terminal means for inputting signals therefrom to control the control means and set the testing apparatus in either "forward shift" mode or "backward shift" mode.

The control means for controlling the direction of the shift of the logical value serves as a switching circuit for changing the order of connecting the SRLs placed in the shift path in accordance with the signal inputted from the terminal means. Thereby, the testing apparatus of the present invention can substantially implement a scan-in/scan-out operation in either "forward shift direction" or "backward shift direction".

BRIEF DESCRIPTION OF THE DRAWINGS

These and other objects and many of the attendant advantages of the present invention will be readily appreciated as the same becomes better understood by reference to the following detailed description when considered in connection with the accompanying drawings wherein like parts in each of the figures are designated by the same reference characters and in which.

DETAILED DESCRIPTIONS OF PREFERRED EMBODIMENTS

Figure 1:
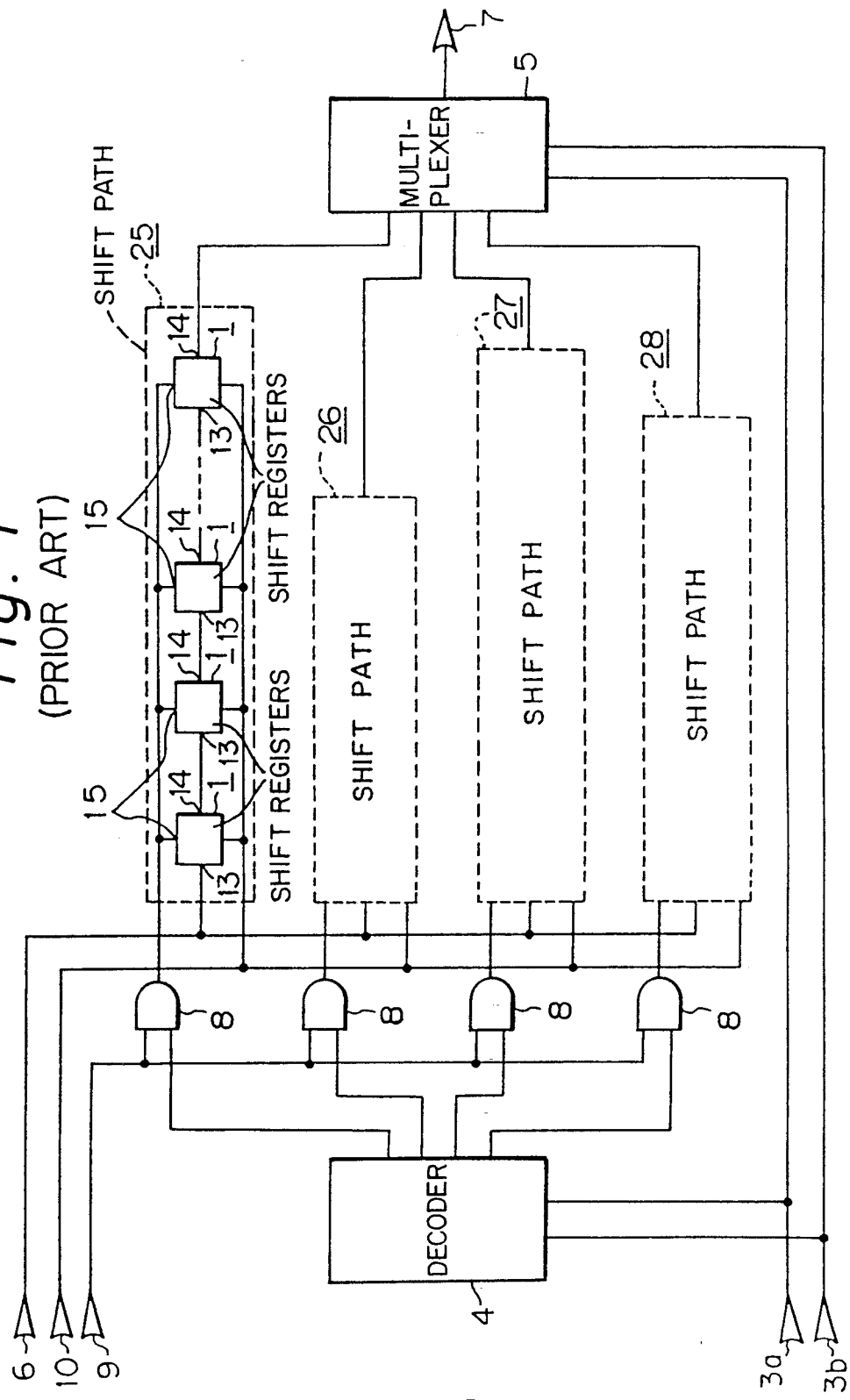
FIG. 1 is a block diagram showing an example of the conventional logical circuit testing apparatus.
Figure 2:
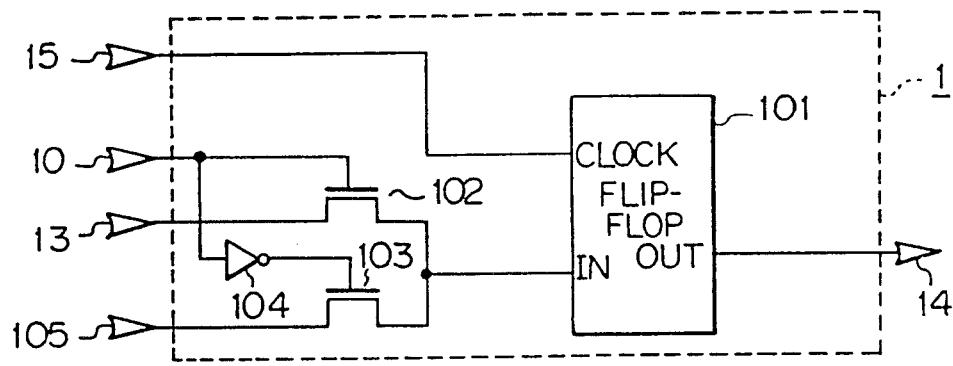
FIG. 2 is a block diagram showing an internal structure of a SRL 1.
Figure 3:
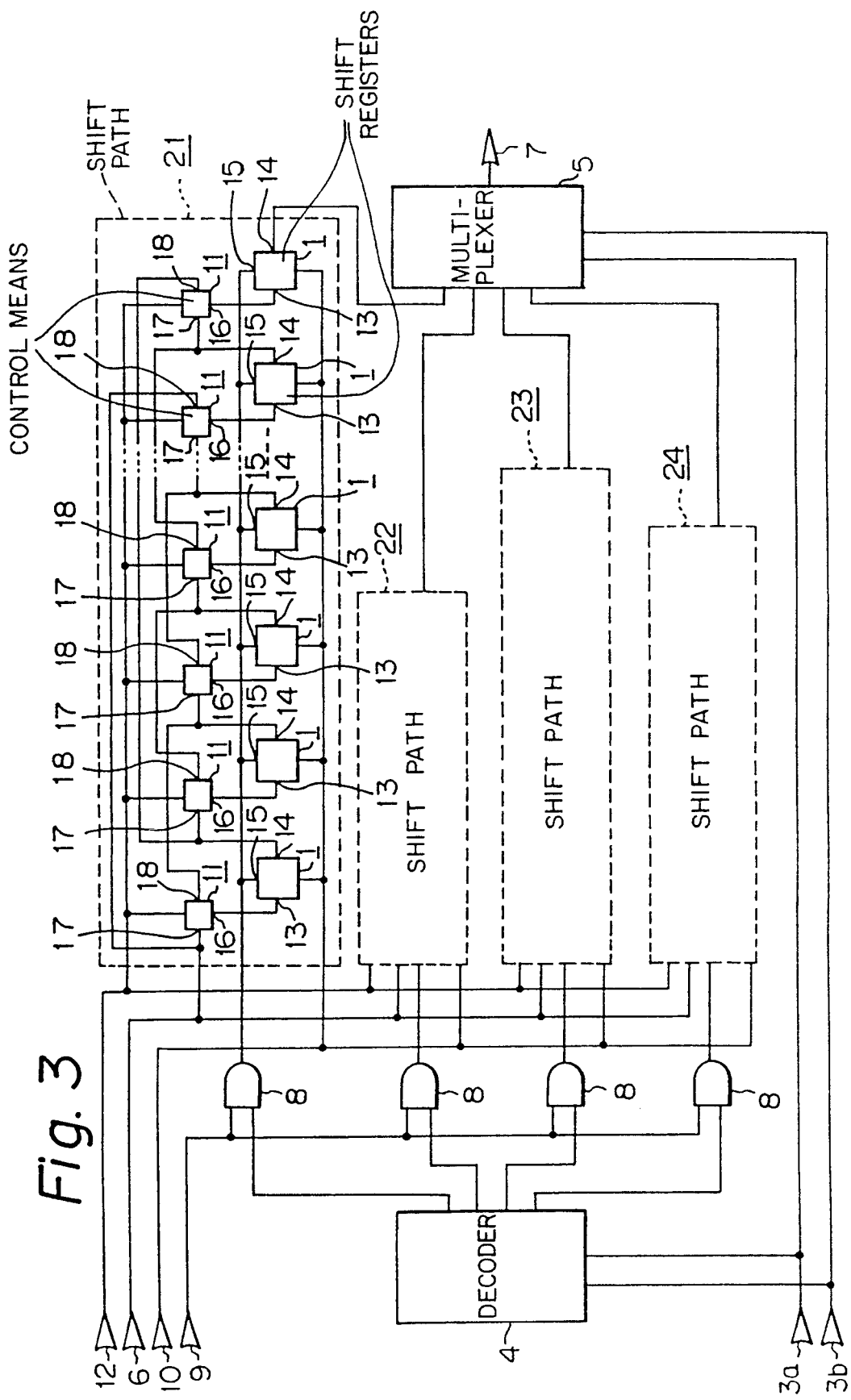
FIG. 3 is a block diagram showing the logical circuit testing apparatus embodying the present invention.

Referring now to FIG. 3 which shows an example of the logical circuit testing apparatus of the present invention, reference numerals 3a, 3b, 4, 5, 6, 7, 8, 9 and 10 indicate the same elements as described above with reference to FIG. 1. further, the internal structure of the SRL 1 is the same as shown in FIG. 2.

Reference numeral 11 designates control means for controlling a direction in which a logical value is shifted in the testing apparatus by switching the direction in accordance with an input signal from a terminal 12. This testing apparatus includes four shift-paths 21, 22, 23 and 24 as the apparatus of FIG. 1 does. Further, the internal structure of each of the shift-paths 21, 22, 23 and 24 is the same as that of the shift-path 21. Furthermore, the terminals 13, 14 and 15 shown in FIG. 3 are the same as the terminals indicated by the same reference numerals shown in FIGS. 1 and 2, respectively.

Moreover, the terminals 16, 17 and 18 will be described hereinbelow with reference to FIGS. 4 and 5.

Figure 4:
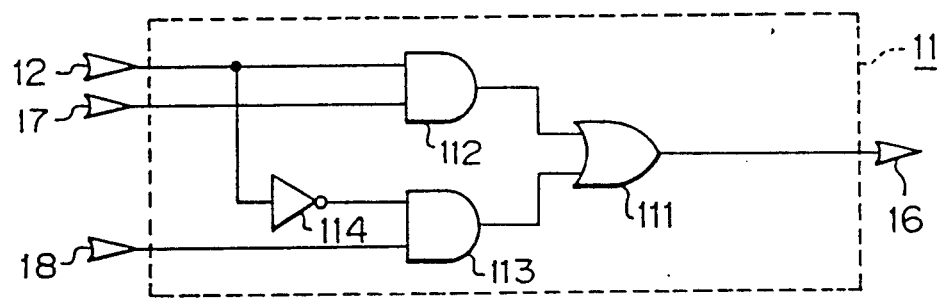
FIGS. 4 and 5 are block diagrams each showing an example of control means for controlling a direction of a shift of a logical value in the testing apparatus of the present invention.

Turning now to FIG. 4, is shown an example of the internal structure of the control means 11 therein. As shown in this figure, the control means 11 consists of an OR circuit 111, AND circuits 112 and 113 and an inverter or NOT circuit 114. This inverter 114 is a logical circuit used to invert a control signal fed from the control means 12. The terminal 17 is used to receive (i) signals from the SRL 1 preceding the control means 11 of this figure in the "forward shift direction" in the shift-path to which this control means 11 belongs or (ii) those from the "scan-in" terminal 6 if the control means 11 precedes the SRL 1 placed at a first stage (from left, as viewed in FIG. 4) of such a shift-path in the "forward shift direction". On the other hand, the terminal 18 is used to receive (i) signals from the SRL 1 placed at a stage immediately posterior to this control means 11 in the "forward shift direction", (ii) those from the "scan-in" terminal 6 if this control means 11 is placed immediately prior to the second last SRL 1 of the shift-path in the "forward shift direction", or (iii) those from the first SRL 1 if this control means 11 is placed immediately prior to the last SRL 1 of the shift-path in the "forward shift direction". Further, the terminal 16 is used to output a signal to one of the SRLs 1.

In the testing apparatus of FIG. 3 employing the control means 11 constructed as above described, the mode of an operation is, as similarly in the prior art testing apparatus above, switched between the scan and normal modes by inputting a signal of high-level "H" from the terminal 10 in case of setting the testing apparatus into the scan mode and by inputting that of low-level "L" from the terminal 10 in case of setting the apparatus into the normal mode. Further, an operation of the testing apparatus of FIG. 3 in the normal mode is the same as that of the prior art testing apparatus because each of the SRLs 1 is independent of the shift-path as in the prior art testing apparatus.

Hereafter, an operation of the testing apparatus of FIG. 3 in the scan mode will be described by comparing with that of the prior art apparatus in the scan mode. Here, it is assumed that the shift-paths 25, 26, 27 and 28 correspond to the shift-paths 21, 22, 23 and 24, respectively.

By way of an example, the shift-path 21 will be described hereinbelow by comparing with the shift-path 25 of the prior art apparatus.

Assuming that the shift-path 25 consists of N SRLs 1 (N is an integer), the shift-path 21 consists of (N+1) SRLs 1. That is, the shift-path provided in the apparatus of the present invention requires one more SRL than that of the prior art apparatus. Such an additional SRL 1 is not used for being set a logical value therein but used for storing a logical value which is to be outputted to the multiplexer 5 during the "scan-out" operation. thus, the input terminal 105 of the additional SRL 1 is open in the normal mode. Hereafter, the SRLs will be called a first SRL, a second SRL and so on from the SRL placed at the first stage (from left, as viewed in FIG. 3) of the shift-path to the SRL placed at the last stage of the shift-path.

First, in case of setting the apparatus into the "forward shift" mode, a signal of high-level "H" is inputted at the terminal 12. Thereby, a signal of high-level "H" goes into the AND circuit 112 and a signal of low-level "L" goes through the inverter 114 into the AND circuit 113. Thus, the AND circuit 113 outputs a signal of low-level "L" independently with the signal inputted to the terminal 18. The AND circuit 12 outputs to the OR circuit 111 the signal inputted from the terminal 17 as it is and further the OR circuit 111 also outputs the received signal as it is at the terminal 16 to a SRL 1 of the control means 11. Thus, the SRLs 1 of the shift-path 21 are connected by way of the control means 11 in sequence as follows:

the terminal 6—the control means 11—the first SRL 1—the control means 11—the second SRL 1—the control means 11—. . . —the Nth SRL 1—the control means 11—the (N+1)th SRL 1—the multiplexer 5—the terminal 17.

Therefore, the manner of connecting the SRLs 1 in the shift-path 21 is the same as in the shift-path 25 except for the respects that the control means 11 intervenes between each pair of the successively numbered SRLs and that the additional SRL 1 is added to the shift-path. Thus, when implementing the "scan-in" operation, the operation is effected in the same manner as above described in the description of the prior art apparatus. In case of implementing the "scan-out" operation, it is, however, necessary for the testing apparatus of the present invention to input L 25 clock signals during (N+1) times a period of time of the clock signal. In contrast, it is sufficient for the prior art testing apparatus to input the clock signal during only N times a period of time of the clock signal. Further, the logical values are outputted to the terminal 7 from the (N+1)th SRL 1, the Nth SRL 1, . . . and the first SRL 1 in that order. That is, except for readout of the logical value from the (N+1)th SRL, the readout operation of the testing apparatus of the present invention in the "forward shift" mode is the same as of the conventional testing apparatus.

Next, in case of setting the testing apparatus into the "backward shift" mode, a signal of low-level "L" is inputted at the terminal 12. Thereby, a signal of low-level "L" goes into the AND circuit 112 and on the other hand a signal of the high-level "H" goes into the AND circuit 113 by way of the inverter 114. Thus, the AND circuit 112 outputs a signal of low-level "L" irrespective of the input signal to the terminal 17. The AND circuit 113 outputs to the OR circuit 111 the signal inputted from the terminal 18 as it is. Thereafter, the input signal from the terminal 18 is outputted from the terminal 16 of the control means 11 to a SRL 1 through the OR circuit 113 without being changed while passing through this control means 11. In this case, the SRLs 1 of the shift-path 21 are connected by way of the control means 11 in sequence as follows:

the terminal 6—the control means 11—the Nth SRL 1—the control means 11—the (N-1) SRL 1—the control means 11—. . . —the first SRL 1—the control means 11—the (N+1)th SRL 1—the multiplexer 5—the terminal 7.

Thus, comparing the order of connecting the SRLs 1 in the "backward shift" mode with that in the "forward shift" mode, the first to Nth one of the SRLs are connected in reverse order. In case of implementing an "scan-in" operation, logic values to be set in the shift-path are to be inputted form the terminal 6 in synchronism with the clock signal in an order reverse to the order used in the "forward shift" mode. Further, in case of implementing an "scan-out" operation, it is necessary to input the clock signal into the apparatus during (N+1) times a period of the clock signal as in the "forward shift" mode. The data set or stored in the SRLs 1 are output to the terminal 7 from the (N+1)th SRL 1, the first SRL 1, . . . and the Nth SRL 1 in that order. Thus, a set of the logical values set in the first to Nth SRLs are obtained by the readout of the contents of these SRLs with skipping the (N+1)th SRL 1.

For instance, if a failure occurs in a Mth ($1 \leq M \leq N$) SRL 1 of the "scan-path" or shift-path 25 of the prior art apparatus and the Mth SRL 1 outputs only a signal of high-level "H", all signals each indicating a logical value outputted from the first to Nth SRLs 1 in the "scan-out" operation are of high-level "H". Thus, an operator or user cannot locate the failing SRL 1 in the prior art testing apparatus.

On the other hand, if the same failure occurs in a Mth SRL of the "scan-path" or shift path 21, signals of low-level "L" are firstly inputted to the first to Nth SRLs 1 in the "forward shift direction". Next, the "scan-out" operation is effected in the shift-path in the "backward shift direction". Thus, a set of logical values obtained by reading out of the SRLs with skipping the (N+1)th SRL 1 is designated as a sequence "l, l, . . . , l, h, . . . , h". Here, l and h indicate logical values (for example, "0" and "1" ( respectively) corresponding to the low- or high-levels "L" and "H" of the output signals from the SRLs 1, respectively. That is, in such a sequence, the portion corresponding to the outputs from the Mth to Nth SRLs 1 is made up of only a logical value "h". Thereby, an operator can locate the failing Mth SRL 1 in the testing apparatus of the present invention.

Moreover, it goes without saying that if a failing SRL 1 outputs only a signal of low-level "L", an operator can locate the failing SRL 1 by first inputting a signal of high-level "H" to all the SRLs 1 and further effecting the same processes as described above in relation to the case that the failing SRL 1 outputs only a signal of low-level "L".

Figure 5:
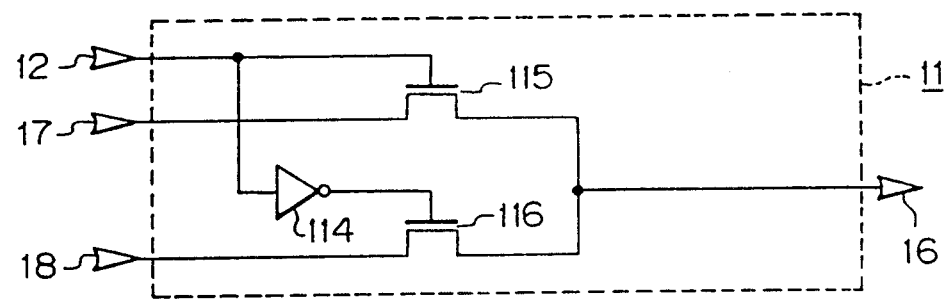

Further, the control means 11 may be made up of the "N ch T G"s 115 and 116 as shown in FIG. 5 in place of the OR circuit 111 and the AND circuits 112 and 113 of the above described embodiment. In this alternative embodiment, if a signal of high-level "H" is inputted from terminal 12, the "N ch T G" 115 turns on and to the contrary the "N ch T G" 116 turns off. Thus, a signal inputted from the terminal 17 into the control means 11 is outputted from the terminal 16 without being changed. If a signal of low-level "L" is inputted from the terminal 12, the "N ch T G" 115 turns off and to the contrary the "N ch T G" 116 turns on. Thus, in this case, a signal inputted from the terminal 18 is outputted from the terminal 16. Accordingly, the control means 11 of FIG. 5 can provide the same effects as that of FIG. 4 does.

While the invention has been particularly shown in described with reference to preferred embodiments thereof, it will be apparent to those skilled in the art that various modifications and variation could be made to the embodiments of the invention as herein above described without departing from the spirit and scope of the invention.

What is claimed is:

1. A logic circuit testing apparatus operable to implement scan-in/scan-out operation comprising:

a shift path means for storing logical values comprising a plurality of shift registers, each of the shift registers including register means and a mode switching means coupled to said register means for selecting either normal data or test data to be stored in the shift path means;

said mode switching means comprising circuit means including first and second gate means and first gate control means, said first and second gate means having outputs coupled to said register means, said first gate means having an input for receiving said test data, said second gate means having an input for receiving said normal data, said first gate control means coupled to said first and second gate means and having means responsive to a mode select signal for mutually exclusively enabling and disabling said first and second gate means;

a plurality of direction control means for controlling a shift direction of the shift path means so that the shift path means shift data bidirectionally, each of said direction control means having an output respectively coupled to one of said shift registers;

said direction control means comprising circuit means including third and fourth gate means and second gate control means, said third and fourth gate means having outputs coupled independently of any of said register means to said input of said first gate means, said third gate means having an input for receiving said test data when said shift path means are shifting data in one of said bidirectional shift directions, said fourth gate means having an input for receiving said test data when said shift path means are shifting data in the other one of said bidirectional shift directions, said second gate control means coupled to said third and fourth gate means and having means responsive to a direction control signal for mutually exclusively enabling and disabling said third and fourth gate means.

2. An apparatus according to claim 1 wherein said first and second gate means comprises transmission gate means.

3. An apparatus according to claim 2 wherein said first gate control means comprises inverter gate means.

4. An apparatus according to claim 3 wherein said third and fourth gate means comprise transmission gate means.

5. An apparatus according to claim 4 wherein said second gate control means comprises inverter gate means.

6. An apparatus according to claim 3 wherein said third and fourth gate means comprise AND circuit means.

7. An apparatus according to claim 6 wherein said second gate control means comprises inverter means.

8. An apparatus according to claim 7 further comprising OR gate means coupling said outputs of said third and fourth gate means to said input of said first gate means.

9. An apparatus according to claim 1, wherein said shift path means further comprises a plurality of shift paths, and said apparatus further having a shift path select means for selecting one of the shift paths to be operated.

10. An apparatus according to claim 9, wherein said shift path select means comprises a decoding means for outputting a shift path select signal formed by decoding to a selected one of the shift paths and a multiplexing means for outputting only data from the shift path selected by the decoding means to a scan-out terminal.

* * * * *